(12) United States Patent
Reyzin et al.

(10) Patent No.: US 7,475,718 B2
(45) Date of Patent: Jan. 13, 2009

(54) ORIENTATION INSENSITIVE MULTI CHAMBER THERMOSIPHON

(75) Inventors: Ilya Reyzin, Williamsville, NY (US); Mohinder Singh Bhatti, Amherst, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 70 days.

(21) Appl. No.: 11/599,942

(22) Filed: Nov. 15, 2006

(65) Prior Publication Data

US 2008/0110599 A1    May 15, 2008

(51) Int. Cl.
F28D 15/00 (2006.01)
F28F 7/00 (2006.01)
H05K 7/20 (2006.01)

(52) U.S. Cl. .......................... 165/104.33; 165/104.21; 165/80.3

(58) Field of Classification Search ................ 165/80.3, 165/80.4, 104.33, 104.34, 104.26, 121, 125; 361/695, 697, 700; 257/715; 174/15.2, 16.3
See application file for complete search history.

(56) References Cited

U.S. PATENT DOCUMENTS

| | | | | |
|---|---|---|---|---|
| 3,673,306 A | * | 6/1972 | Kirkpatrick | 174/16.3 |
| 5,632,158 A | * | 5/1997 | Tajima | 62/259.2 |
| 6,085,831 A | | 7/2000 | DiGiacomo et al. | 165/104.33 |
| 6,088,915 A | * | 7/2000 | Turturro | 29/840 |
| 6,382,306 B1 | * | 5/2002 | Hsu | 165/80.3 |
| 6,695,039 B1 | | 2/2004 | Reyzin et al. | 165/104.21 |
| 6,913,072 B2 | * | 7/2005 | Luo | 165/104.21 |
| 7,120,019 B2 | * | 10/2006 | Foster et al. | 361/695 |
| 7,269,013 B2 | * | 9/2007 | Chen et al. | 361/700 |
| 2001/0050164 A1 | * | 12/2001 | Wagner et al. | 165/104.33 |
| 2004/0108104 A1 | * | 6/2004 | Luo | 165/181 |
| 2005/0061486 A1 | * | 3/2005 | Yang | 165/104.33 |
| 2005/0280992 A1 | * | 12/2005 | Carter et al. | 361/697 |
| 2007/0240849 A1 | * | 10/2007 | Lin et al. | 165/80.4 |

FOREIGN PATENT DOCUMENTS

JP      11183067 A  *  7/1999

* cited by examiner

*Primary Examiner*—Tho v Duong
(74) *Attorney, Agent, or Firm*—Patrick M. Griffin

(57) ABSTRACT

A hermetically sealed housing includes a plurality of inner walls extending radially from a central post to a circular outer wall, thereby defining a plurality of pie shaped chambers, each independently containing a refrigerant. At least one of the chambers is always in position to remove heat from an electronic device regardless of the orientation of the heat exchanger assembly. A plurality of side fins are disposed on the outer wall of the housing, and a plurality of top fins extend radially from a central axis (A) and are disposed on top of the housing. A wicking material is disposed on the interior of each chamber. A fan assembly is disposed on top of the top fins to blow air radially down into the fins.

8 Claims, 3 Drawing Sheets

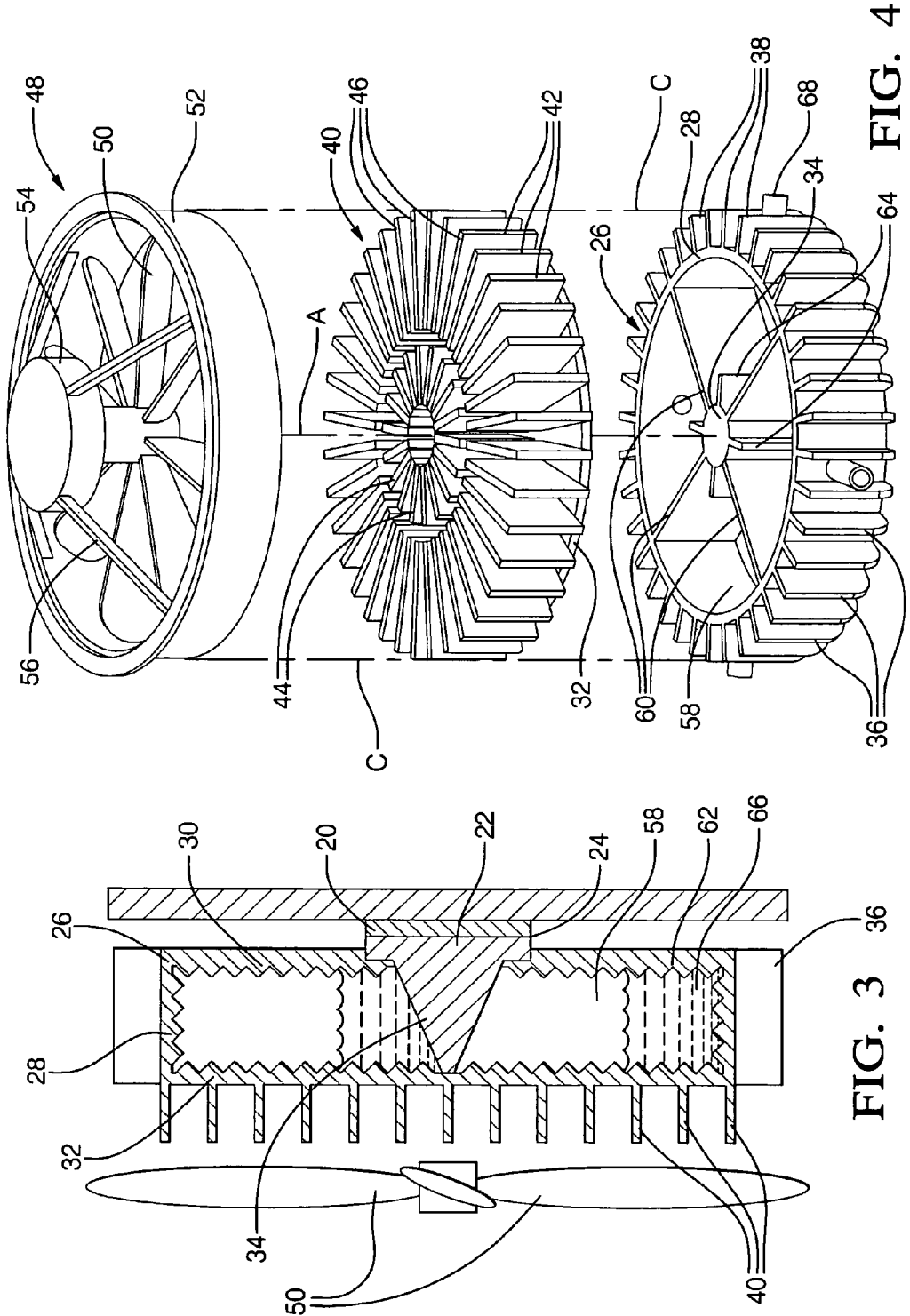

ORIENTATION INSENSITIVE MULTI CHAMBER THERMOSIPHON

BACKGROUND OF THE INVENTION

1. Field of the Invention

The present invention relates to an orientation insensitive heat exchanger assembly for cooling an electronic device.

2. Description of the Prior Art

The operating speed of computers is constantly being improved to create faster computers. With this, comes increased heat generation and a need to effectively dissipate that heat. As laptop computers become more universal, the ability to position these heat exchangers and other parts in any one of numerous orientations become of greater importance.

Heat exchangers and heat sink assemblies have been used that apply natural or forced convection cooling methods to dissipate heat from electronic devices that are highly concentrated heat sources such as microprocessors and computer chips; however, air has a relatively low heat capacity. Thus, liquid-cooled units called LCUs employing a cold plate in conjunction with high heat capacity fluids have been used to remove heat from these types of heat sources. Although, LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing a working fluid housed on the boiler plate of the unit. The boiling of refrigerant constitutes a phase change from liquid-to-vapor state as such the refrigerant of the TCU is considered to be a two phase fluid. Vapor generated during boiling of the refrigerant is then transferred to a condenser, where it is liquefied by the process of film condensation over the condensing surface of the TCU. The heat is rejected into a stream of air flowing over fins extending from the condenser and the condensed liquid is returned back to the boiler plate by gravity. As a result, most TCUs must be positioned in a predetermined orientation in order for the refrigerant to continue the boiling-condensing cycle, thus making the TCU orientation sensitive.

To solve this problem orientation insensitive thermosiphons, or heat exchangers, have been used. An example of a thermosiphon is U.S. Pat. No. 6,695,039 to Reyzin et al. Also relevant is U.S. Pat. No. 6,085,831 to DiGiacomo et al.

The '039 patent is a thermosiphon assembly including a housing for holding a refrigerant for liquid-to-vapor transformation, and heat transfer fins disposed in the housing. The housing includes one chamber which is in contact with a boiler plate for transferring heat from the electric device. The chamber extends upwardly at an angle such that the thermosiphon can operate in both a vertical and a horizontal position and any angle of tilt there between. However, the assembly cannot be rotated a full revolution while in a tilted or horizontal position and remain operational.

The '831 patent is a heat exchanger assembly including a housing for holding refrigerant and a top wall wherein heat transfer fins are disposed on the top wall. The housing includes a plurality of condensing chambers extending upwardly and outwardly along a single vertical plane. Although this assembly has a plurality of condensing chambers, refrigerant is not present in all chambers, nor are the chambers hermetically sealed.

SUMMARY OF THE INVENTION AND ADVANTAGES

The invention provides an orientation insensitive heat exchanger assembly for cooling an electronic device comprising a hermetically sealed housing having inner walls defining a plurality of chambers. A refrigerant is disposed in each of the chambers of the housing for liquid to vapor transformation. The refrigerant in each of the chambers is independent of the refrigerant in the other chambers.

The assembly of the present invention is suitable for operation not only in the horizontal and vertical orientations, but additionally at any angle of tilt therebetween. The assembly also offers a compact arrangement while providing enhancement of heat transfer through the use of heat transfer fins.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 3 is a cross sectional view of the embodiment shown in FIG. 1 in a vertical position;

FIG. 4 is a perspective exploded view of the preferred embodiment of the invention.

DETAILED DESCRIPTION OF THE INVENTION

Referring to the Figures, wherein like numerals indicate like parts throughout the several views, an orientation insensitive heat exchanger assembly is generally shown for cooling an electronic device 20.

Figure 2:
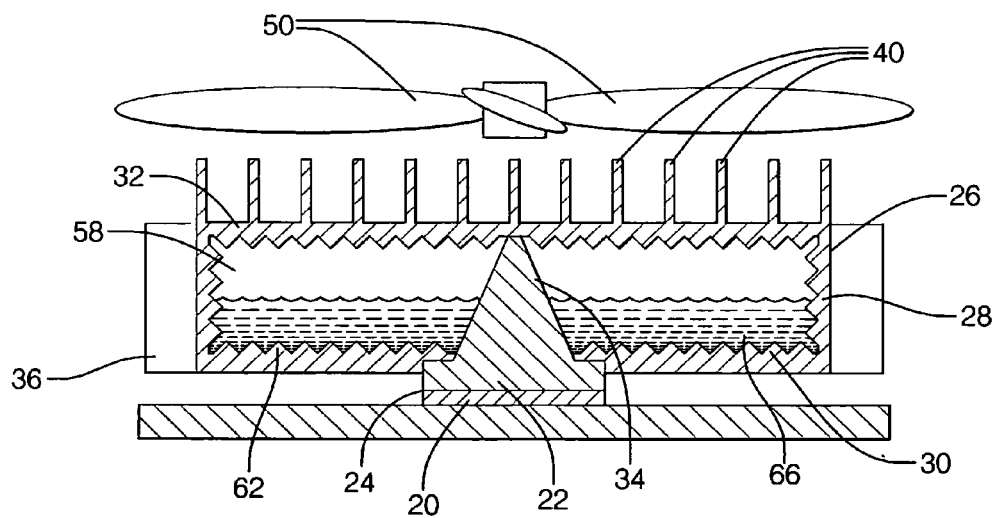
FIG. 2 is a cross sectional view of the embodiment shown in FIG. 1.

The assembly includes a boiler plate 22 for transmitting heat from an electronic device 20 through a thermal grease 24 disposed between a bottom surface of the boiler plate 22 and the electronic device 20, as illustrated in FIG. 2. The thermal grease 24 fills in surface defects to form a better contact between the boiler plate 22 and the electronic device 20.

Figure 5:
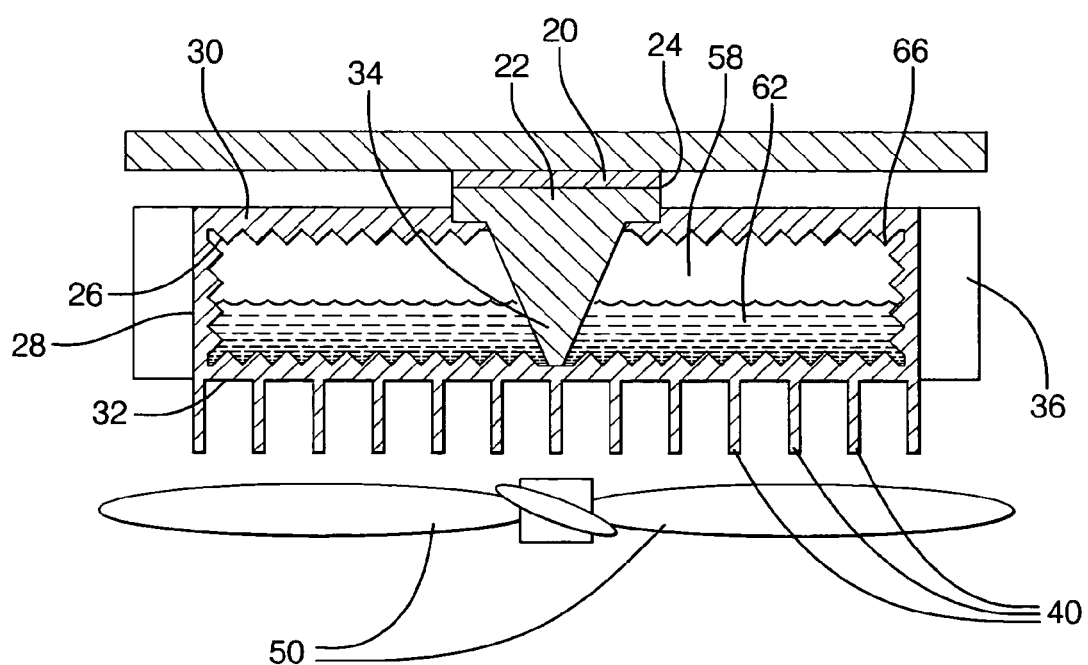
FIG. 5 is a cross sectional view of the embodiment shown in FIG. 1 in an upside down position.

A hermetically sealed housing 26 generally indicated is disposed about a central axis A. The housing 26 is shown to have a cylindrical shape having a circular cross-section, but can also have other shapes such as a cube. The housing 26 has at least one outer wall 28 and a bottom wall 30 and a top wall 32 sealed to one another, as shown in FIG. 4. The housing 26 includes a post 34 disposed about the central axis A and extending upwardly from the bottom wall 30 to the top wall 32. The post 34 has a conical shape, as shown in FIGS. 2, 3 and 5, but may also have a cylindrical shape having a circular cross-section, as shown in FIG. 4, or other cross-sections.

A plurality of side fins 36 are equally spaced from one another circumferentially around the outer wall 28. The side fins 36 extend radially outwardly from the outer wall 28 to the axially extending first outer edges 38 at an outer imaginary cylinder C having a circular cross-section. The side fins 36 extend axially from the top wall 32 to the bottom wall 30 and dissipate heat from the housing 26 to the ambient air moving between and over the side fins 36.

Figure 1:
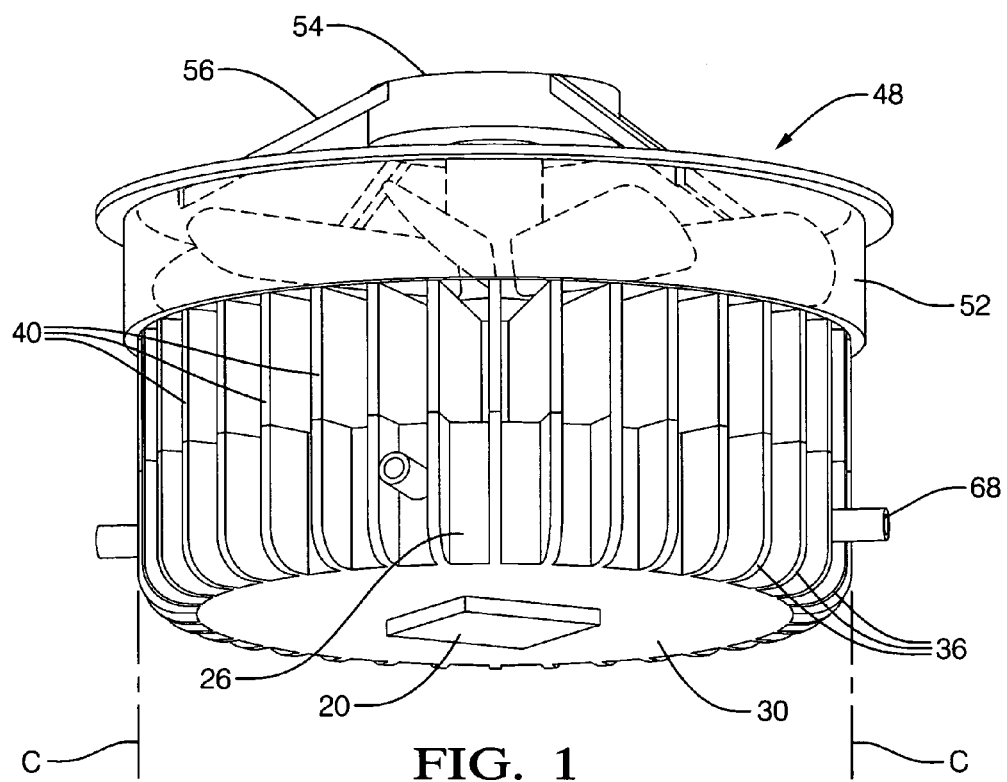
FIG. 1 is a perspective view of the preferred embodiment of the invention in a horizontal position.

A plurality of top fins 40 generally shown are also shown in FIG. 4 and extend upwardly from the top wall 32 of the housing 26 and extend radially outwardly from the central axis A to second outer edges 42 at the outer imaginary circular cylinder C. These fins dissipate heat from the top wall 32 to the ambient air moved over the top fins 40. The top fins 40 include a set of inner fins 44 and a set of outer fins 46 disposed on the top wall 32 of the housing 26. The inner fins 44 extend radially outwardly from the central axis A to an imaginary inner circle and are equally spaced circumferentially. The outer fins 46, also equally spaced circumferentially, extend radially outwardly from the inner circle of the inner fins 44 to the second outer edges 42 at the outer imaginary circular cylinder C. The top fins 40 and the side fins 36 can align vertically or axially as seen in FIG. 1.

A fan assembly 48 generally indicated is disposed on the top fins 40 and along the central axis A and, is included for blowing air downwardly into and radially outwardly between the top fins 40. The fan assembly 48 includes a plurality of fan blades 50 disposed about the central axis A for blowing air. The fan blades 50 draw air axially into the fan and downward to the top fins 40. A shroud 52, having a circular cylindrical shape, is disposed on the top fins 40 and surrounds the fan blades 50. A motor 54 is included in the fan assembly 48 for rotating the fan blades 50. A cage 56 extends radially inwardly from the shroud 52 and supports the motor 54. The cage 56 is open between the spokes openings for allowing outside air to flow into the fan assembly 48.

As mentioned, the fan is included for blowing air between the top fins 40. When the top fins 40 and side fins 36 are aligned vertically, straight or aligned chambers 58 are formed through which the air can flow. When the top fins 40 and side fins 36 have a circular offset, the air flow would be interrupted, thus creating a turbulent or non-linear flow.

The assembly is distinguished by including a plurality of inner walls 60 disposed in the housing 26 which extend radially from the central axis A to the outer wall 28 to define a plurality of pie shaped chambers 58. Each inner wall 60 intersects and extends radially from the central axis A to a curved segment of the outer wall 28. The chambers 58 are independently hermetically sealed from one another. A refrigerant 62 is disposed in each of the chambers 58 of the housing 26 for liquid to vapor transformation. Each chamber 58 holds an equal amount of refrigerant 62 and includes an interior surface defined by the top wall 32, bottom wall 30 and outer wall 28. The chambers 58 are not entirely filled by the refrigerant 62 and the remaining empty portion accommodates the boiled off vapor.

A plurality of interior fins 64 are disposed on the post 34 and extend radially outwardly from the bottom wall 30 to the top wall 32 with each of the interior fins 64 being associated with one of the chambers 58.

A wicking material 66 is disposed on the interior surfaces of each chamber 58. The wicking material 66 performs an essential function by absorbing a portion of the refrigerant 62 disposed in the chambers 58. This in turn cools the walls in contact with the wicking material 66. This especially aids in cooling when the electronic device 20 is in a position other than a horizontal one. In FIG. 3. only a portion of the refrigerant 62 directly cools the electronic device 20 without the aid of the wicking material 66. The refrigerant 62 on the bottom of the lower chamber 58 is wicked to aid in the cooling of the device. In an upside down position, as seen in FIG. 5, the wicking material 66 is essential and wicks the refrigerant 62 to the walls in contact with the electronic device 20.

A plurality of charge ports 68 are disposed on the outer wall 28 of the housing 26 interleaved with the side fins 36. Each of the chambers 58 are associated with one of the charge ports 68 which extend into the chambers 58 for supplying refrigerant 62 to each of the chambers 58 independently of the other chambers 58. When operating, the electronic device 20 generates of heat to be dissipated. The heat is transferred from the electronic device 20 to the boiler plate 22 and thereafter causes the refrigerant 62 in the chambers 58 to boil. Vapor boiled off the refrigerant 62 rises and condenses. Heat is transferred from the walls to the fins and is then released from the fins into the ambient air.

When the assembly is positioned horizontally, as seen in FIG. 2, the wall in contact with the electronic device 20 is entirely covered by the refrigerant 62 in the chambers 58. When the assembly is rotated 90 degrees as seen in FIG. 3, or any angle there between, a portion of the refrigerant 62 remains in contact with the wall engaging the electronic device 20. In FIG. 5, the assembly is in an upside down position. The electronic device 20 is cooled by the wicked refrigerant 62; accordingly the device is orientation insensitive.

Obviously, many modifications and variations of the present invention are possible in light of the above teachings. The invention may be practiced otherwise than as specifically described within the scope of the appended claims. The reference numerals in the claims are merely for convenience and are not to be read in any way as limiting.

What is claimed is:

1. An orientation insensitive heat exchanger assembly for cooling an electronic device comprising;
    a boiler plate for transmitting heat from an electronic device,
    a hermetically sealed housing defining a plurality of independently sealed chambers, wherein said housing includes a top wall and a bottom wall and at least one outer wall disposed about a central axis (A) and a plurality of inner walls intersecting at said central axis (A) and extending radially from said central axis (A) to said outer wall,
    a refrigerant disposed in each of said chambers of said housing for liquid to vapor transformation of said refrigerant in each of said chamber independent of said refrigerant in other said chambers,
    a plurality of side fins equally spaced from one another circumferentially around said outer wall, and
    a plurality of charge ports disposed on said outer wall of said housing interleaved with said side fins with each of said chambers being associated with one of said charge ports for supplying liquid to each of said chambers.

2. An assembly as set forth in claim 1 including a thermal grease on a bottom surface of said boiler plate for engaging an electronic device.

3. An assembly as set forth in claim 1 including a plurality of top fins extending upwardly from said top wall of said housing and extending radially outwardly from said central axis (A) to second outer edges at an outer imaginary cylinder (C) having a circular cross-section for dissipating heat from said top wall.

4. An assembly as set forth in claim 3 including a fan assembly disposed on said top fins for blowing air downwardly onto said top wall.

5. An assembly as set forth in claim 4 including a plurality of fan blades disposed about said central axis (A) for blowing air and a shroud having a cylindrical shape having a circular cross-section disposed on said top fins and surrounding said fan blades and a motor for rotating said fan blades and a cage extending radially inwardly from said shroud and supporting said motor.

6. An orientation insensitive heat exchanger assembly for cooling an electronic device comprising:
- a boiler plate for transmitting heat from an electronic device,
- a thermal grease for disposition between a bottom surface of said boiler plate and an electronic device,
- a hermetically sealed housing having a cylindrical shape having a circular cross-section disposed about a central axis (A),
- said housing being hermetically sealed by having at least one outer wall and a bottom wall and a top wall sealed to one another,
- a plurality of inner walls extending radially from said central axis (A) to said outer wall to define a plurality of pie shaped chambers disposed in said housing and each extending radially from said central axis (A) to a curved segment of said outer wall,
- a post disposed about said central axis (A) extending from said bottom wall upwardly to said top wall,
- a plurality of interior fins disposed on said post and extending radially outwardly from said top wall to said bottom wall with each of said interior fins being associated with one of said chambers,
- a wicking material disposed on an interior surface including said top wall and said bottom wall and said outer wall of said chambers,
- a refrigerant disposed in each of said chambers of said housing for liquid to vapor transformation,
- a plurality of side fins equally spaced from one another circumferentially around said outer wall,
- said side fins extending radially outwardly from said outer wall to axially extending first outer edges at an outer imaginary cylinder (C) having a circular cross-section and from said top wall to said bottom wall for dissipating heat from said refrigerant in said chambers,
- a plurality of charge ports disposed on said outer wall of said housing interleaved with said side fins with each of said chambers being associated with one of said charge ports for supplying liquid to each of said chambers,
- a plurality of top fins equally spaced from on another and extending upwardly from said top wall of said housing and extending radially outwardly from said central axis (A) to second outer edges at said outer imaginary circular cylinder (C) for dissipating heat from top wall,
- a fan assembly disposed on said top fins for blowing air downwardly into and radially outwardly between said top fins,
- said fan assembly including a plurality of fan blades disposed about said central axis (A) for blowing air and a shroud having a cylindrical shape having a circular cross-section disposed on said top fins and surrounding said fan blades and a motor for rotating said fan blades and a cage extending radially inwardly from said shroud and supporting said motor.

7. An assembly as set forth in claim 6 wherein said post has a conical shape.

8. An assembly as set forth in claim 6 wherein said post has a cylindrical shape having a circular cross-section.

* * * * *